(12) United States Patent
Worthington et al.

(10) Patent No.: US 8,990,538 B2
(45) Date of Patent: Mar. 24, 2015

(54) MANAGING MEMORY WITH LIMITED WRITE CYCLES IN HETEROGENEOUS MEMORY SYSTEMS

(75) Inventors: Bruce L. Worthington, Redmond, WA (US); Swaroop V. Kavalanekar, Issaquah, WA (US); Robert P. Fitzgerald, Fall City, WA (US); René A. Vega, Scotts Valley, CA (US)

(73) Assignee: Microsoft Corporation, Redmond, WA (US)

( * ) Notice: Subject to any disclaimer, the term of this patent is extended or adjusted under 35 U.S.C. 154(b) by 347 days.

(21) Appl. No.: 12/940,780

(22) Filed: Nov. 5, 2010

(65) Prior Publication Data

US 2012/0117304 A1    May 10, 2012

(51) Int. Cl.
G06F 13/00     (2006.01)
G06F 13/28     (2006.01)
G06F 11/30     (2006.01)
G06F 12/02     (2006.01)
G11C 16/34     (2006.01)
G06F 12/06     (2006.01)

(52) U.S. Cl.
CPC ........ G06F 11/3037 (2013.01); G06F 11/3055 (2013.01); G06F 12/0223 (2013.01); G11C 16/349 (2013.01); G06F 12/06 (2013.01); G06F 2212/205 (2013.01)
USPC ..... 711/173; 711/170; 711/103; 711/E12.008

(58) Field of Classification Search
None
See application file for complete search history.

(56) References Cited

U.S. PATENT DOCUMENTS

| 5,457,696 | A | 10/1995 | Mori |
| 6,353,910 | B1 | 3/2002 | Carnevale et al. |
| 7,346,755 | B2 | 3/2008 | Pomaranski et al. |
| 7,478,271 | B2 | 1/2009 | Ho |
| 7,478,289 | B1 | 1/2009 | Tamasi et al. |
| 7,523,274 | B2 | 4/2009 | Ryu et al. |
| 7,559,000 | B2 | 7/2009 | Sato |
| 7,571,295 | B2 | 8/2009 | Sakarda et al. |
| 7,581,078 | B2 * | 8/2009 | Ware .............................. 711/203 |
| 7,685,376 | B2 | 3/2010 | Zimmer et al. |
| 7,770,079 | B2 | 8/2010 | Radke et al. |
| 8,412,885 | B2 * | 4/2013 | Cheng et al. ................... 711/128 |

(Continued)

OTHER PUBLICATIONS

Avissar, O. et al., "Heterogeneous Memory Management for Embedded Systems," CASES '01, Atlanta, GA, Nov. 16-17, 2001, 10 pages, http://portal.acm.org/citation.cfm?id=502217.502223.

(Continued)

*Primary Examiner* — Eric S Cardwell
(74) *Attorney, Agent, or Firm* — Henry Gabryjelski; Raghu Chinagudbha; Micky Minhas

(57) ABSTRACT

A method and a memory manager for managing data storage in a plurality of types of memories. The types of memories may comprise a primary memory, such as DRAM, and a secondary memory, such as a phase change memory (PCM) or Flash memory, which may have a limited lifetime. The memory manager may be part of an operating system and may manage the memories as part of a unified address space. Characteristics of data to be stored in the memories may be used to select between the primary and secondary memories to store the data and move data between the memories. When the data is to be stored in the secondary memory, health information on the secondary memory and characteristics of the data to be stored may be used to select a location within the secondary memory to store the data.

21 Claims, 7 Drawing Sheets

(56) References Cited

U.S. PATENT DOCUMENTS

| | | | |
|---|---|---|---|
| 8,627,176 | B2 | 1/2014 | Leischner et al. |
| 2002/0133742 | A1 | 9/2002 | Hsu et al. |
| 2003/0188180 | A1* | 10/2003 | Overney ............... 713/193 |
| 2004/0117688 | A1 | 6/2004 | Vainsencher et al. |
| 2004/0250036 | A1* | 12/2004 | Willman et al. ............ 711/163 |
| 2005/0273605 | A1* | 12/2005 | Saha et al. ............... 713/166 |
| 2009/0144624 | A1* | 6/2009 | Barnes, Jr. ............... 715/719 |
| 2009/0164742 | A1* | 6/2009 | Wach et al. ............... 711/162 |
| 2009/0259806 | A1 | 10/2009 | Kilzer et al. |
| 2010/0031345 | A1* | 2/2010 | Sinclair ..................... 726/19 |
| 2010/0070686 | A1 | 3/2010 | Mergler et al. |
| 2011/0173443 | A1* | 7/2011 | Osterwalder et al. ........ 713/165 |
| 2012/0137167 | A1 | 5/2012 | Leischner et al. |

OTHER PUBLICATIONS

Dhiman, G., et al., "PDRAM: A Hybrid PRAM and DRAM Main Memory System," DAC '09, San Franciso, CA, Jul. 26-31, 2009, 6 pages, http://seelab.ucsd.edu/papers/gdhiman_dac09.pdf.

Qureshi, M.K. et al., "Enhancing Lifetime and Security of PCM-Based Main Memory with Start-Gap Wear Leveling," MICRO '09, New York, NY, Dec. 12-16, 2009, 10 pages, http://www.google.co.in/url?sa=t&source=web&cd=4&ved=0CCkQFjAD
&url=http%3A%2F%2Fciteseerx.ist.psu.
edu%2Fviewdoc%2Fdownload%3Fdoi%3D10.1.1.153.
7213%26rep%3Drep1%26type%3Dpdf
&ei=ORNhTIWmNYP00gSKyPCQCQ
&usg=AFQjCNGMWsML6g2oWjQ-ONUuYon7Tfq07Q
&sig2=GeYoBOUwz9K1ksT9ZwAGuA.

Abts et al., "Architectural Support for Mitigating DRAM Soft Errors in Large-Scale Supercomputers," University of Minnesota Institute of Technology, Dept. Elec. & Computer Eng., Colloquium Mar. 8, 2007, http://citeseerx.ist.psu.edu/viewdoc/download?doi=10.1. 1.133.2709 &rep=rep1&type=pdf, downloaded Nov. 30, 2010.

Calin et al., "Upset-Tolerant CMOS SRAM Using Current Monitoring: Prototype and Test Experiments," Proceedings International Test Conference, Oct. 21-25, 1995, Washington, D.C., USA, Paper 2.4, pp. 45-53, http://ieeexplore.ieee.org/stamp/stamp.jsp?tp= &arnumber=529816.

"Check for RAM Error or Defect in Windows 7 and Vista with Windows Memory Diagnostic," http://www.mydigitallife.Info/2009/10/01/check-for-ram-error-or-defect-in-windows-7-and-vista-with-windows-memory-diagnostic/ published Oct. 1, 2009.

"How To Scan Windows 7 for Memory Errors," http://www.webtlk.com/2009/12/07/how-to-scan-windows-7-for-memory-error, Dec. 7, 2009.

Marsden, A., Memtest86.com—Memory Diagnostic, last updated Jan. 3, 2009, http://www.memtest86.com, downloaded Nov. 12, 2010.

Saha, Goutam Kumar, "A Low-Cost Testing for Transient Faults," *Ubiquity* 7(2), Jan. 17-23, 2006, http://www.acm.org/ubiquity/views/v7i02_lowcost.html.

"Windows Memory Diagnostic," http://oca.microsoft.com/en/windiag.asp ,published 2008, downloaded Sep. 9, 2010.

"Windows Hardware Error Architecture Predictive Failure Analysis," Microsoft Corp., May 5, 2010, http://www.microsoft.com/whdc/system/pnppwr/whea/WHEA_PFA.mspx, downloaded Nov. 30, 2010.

Non-Final Office Action from U.S. Appl. No. 12/956,342, mailed Mar. 26, 2013, 5 pages.

Bivens, A. et al., "Architectural Design for Next Generation Heterogeneous Memory Systems," IEEE, downloaded Aug. 10, 2010, 4 pages.

Notice of Allowance from U.S. Appl. No. 12/956,342, mailed Dec. 10, 2012, 9 pages.

Notice of Allowance from U.S. Appl. No. 12/956,342, mailed Sep. 5, 2013, 6 pages.

Preliminary Amendment filed Mar. 12, 2014 in U.S. Appl. No. 14/148,741, 10 pages.

U.S. Appl. No. 14/148,741, filed Jan. 7, 2014, 29 pages.

Non-Final Office Action mailed Sep. 24, 2014 in U.S. Appl. No. 14/148,741, 8 pages.

Notice of Allowance mailed Jan. 7, 2015 in U.S. Appl. No. 14/148,741, 5 pages.

* cited by examiner

MANAGING MEMORY WITH LIMITED WRITE CYCLES IN HETEROGENEOUS MEMORY SYSTEMS

BACKGROUND

Performance of a computer system depends on an ability of the computer system to store a required amount of data and provide access to the data in an efficient and timely manner. Different memories that may be incorporated into a computer have different characteristics that can impact performance. Progress in computer technologies has led to more types of computer memories that can be employed by a computer system. For example, in addition to volatile memory, such as DRAM, different non-volatile memories exist, such as NAND Flash, NOR Flash, PCM (phase-change memory) and others.

Various types of memories have different characteristics. For example, non-volatile memories such as Flash, which are typically used in memory cards (e.g., in mobile phones), USB flash drives, and solid-state drives, and memories such as PCM, are well suited for long term storage of information since they may not require power to maintain their contents. However, these memories have an expensive write operation, in terms of latency and power consumed, and a limited lifetime, meaning that such memories can endure only a limited number of write cycles. As another example, DRAM may have a very long lifetime and may consume power in order to retain data.

SUMMARY

Applicants have appreciated that overall performance of a computer system may be improved by providing a memory manager that may select among multiple types of memories for storing data. The selection may be based on factors such as characteristics of the memory and/or the data. With such a memory manager, a computer system may reliably use memories such as Flash, PCM and other memories having a limited lifetime and a slow write performance to replace or to supplement DRAM. Specifically, in some embodiments, at least two types of memories comprising DRAM, acting as a primary memory, and Flash, PCM or other similar memory, acting as secondary memory, may be utilized. Such a heterogeneous memory configuration comprising both types of the memories allows taking advantage of features provided by each type of memory while efficiently managing the memories so that to avoid premature wearing out of the secondary memory. Such computer system may thus achieve greater performance, energy efficiency, reliability, availability, serviceability, and lifetime while a cost of the system may be reduced.

The characteristics of the memories used to select among multiple types of memories may include memory health information, which may be obtained from the memory components. Such memory health information may include a lifetime defined as a number of times that a unit of memory can be written to, endurance and others. Hardware components of the computer system may communicate with the operating system to maintain the memory health information for a unit of memory.

In some embodiments, characteristics of data to be stored may be used either separately or in combination with the memory health information to select a memory and/or a location within the memory of the multiple types of memories to store the data. The characteristics of the data may comprise a criticality of the data, an expected persistence of the data, an expected frequency of access of the data, which may be determined based on a historical information on the data. The historical information may be explicitly specified by some piece of software, or may be otherwise determined. For example, if it is determined that the data will be accessed frequently, the data may be stored in a memory acting as a primary memory (e.g., DRAM). However, if it is determined that the data will not be accessed frequently, the data may be stored in a memory acting as a secondary memory (e.g., Flash or PCM), which may support a smaller number of write cycles than the primary memory, but may consume less power than DRAM to retain data.

The foregoing presents a simplified summary of the subject matter in order to provide a basic understanding of some aspects of subject matter embodiments. This summary is not an extensive overview of the subject matter. It is not intended to identify key/critical elements of the embodiments or to delineate the scope of the subject matter. Its sole purpose is to present some concepts of the subject matter in a simplified form as a prelude to the more detailed description that is presented later.

DETAILED DESCRIPTION

Figure 1:
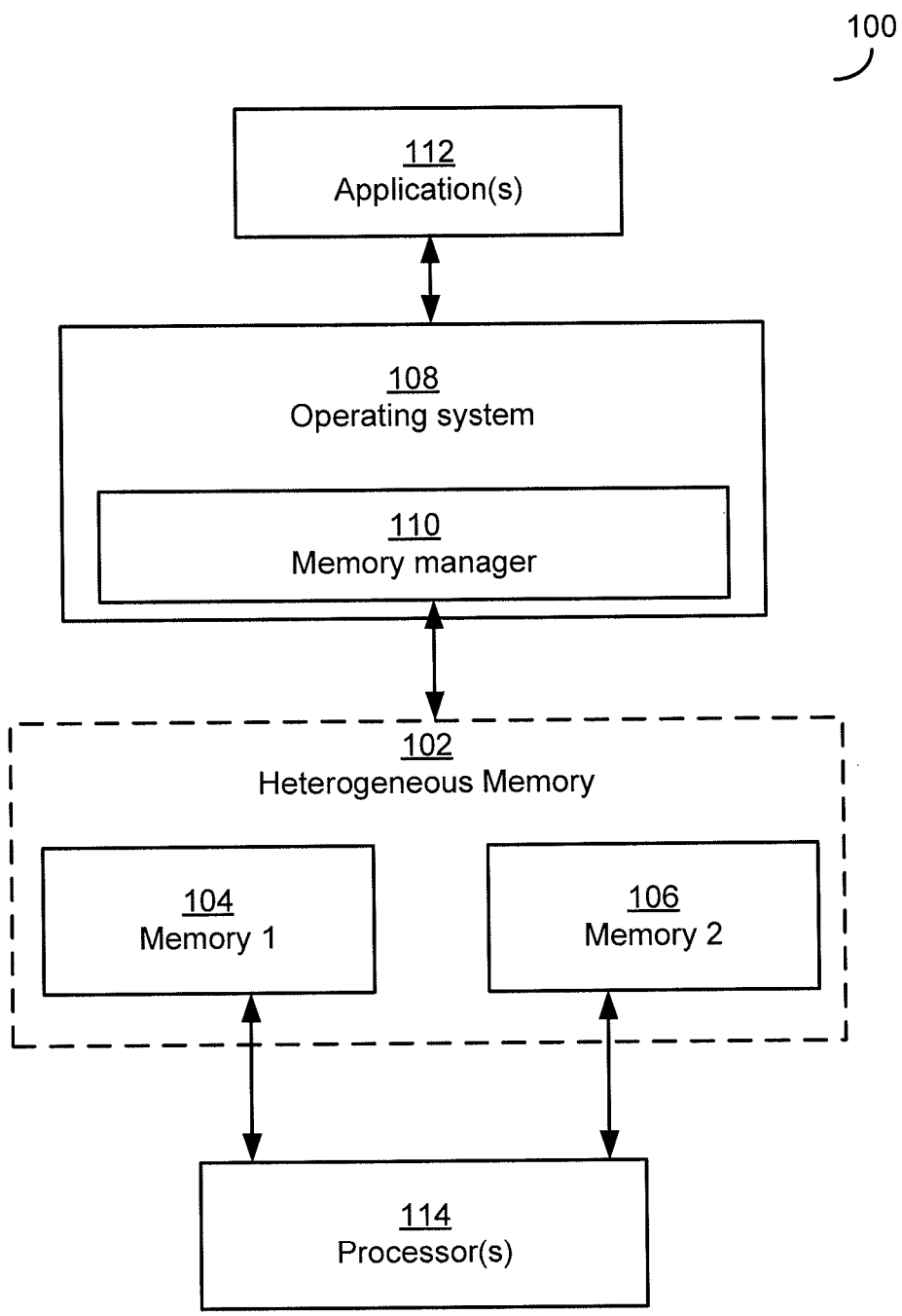
FIG. 1 is a block diagram of a system in which some embodiments may be implemented.

Different types of memories have been developed and continue being developed. Computer systems typically employ dynamic random access memory (DRAM) as a main memory. DRAM is a volatile memory that is widely used in many different computer systems. Furthermore, new memory technologies are becoming available and some existing memory technologies are becoming less expensive, which may provide further advantages if used in addition to or in combination with existing volatile memory types such as DRAM and other memories that are considered conventional.

Accordingly, applicants have appreciated that memories of multiple types may be employed in a computer system, with different types of memories providing respective different advantages. The computer system may automatically select memories of different types for data storage. As a specific example, a heterogeneous memory system may be utilized that includes, as a replacement or a supplement to DRAM, a memory such as a PCM or Flash having a limited lifetime and a slow write performance but at the same time characterized by non-volatility, low power consumption when retaining data, and good read performance. The low power consumption of a memory may comprise a state of the memory when no power is being consumed. Accordingly, in some embodiments, at least two types of memories comprising DRAM, acting as a primary memory, and Flash, PCM or other similar memory, acting as secondary memory, may be utilized. A computer system utilizing a combination of such memories may achieve greater performance, energy efficiency, reliability, availability, serviceability, and lifetime.

Applicants further appreciated and recognized that, to efficiently utilize memories of different types in the heterogeneous memory, an entity may be provided that can manage allocation and reallocation of memory segments among these memories in a unified manner. Accordingly, in some embodiments, a memory manager may be provided that performs such management of storing data in the memories of different types.

The memory manager may keep track of characteristics of each type of memory and select, based on the characteristics, a type of a memory from among the memories to store the data and a location with the memory of the selected type. One of the characteristics of each memory may be referred to as memory health information. The memory health information may be obtained from hardware components of the computer system—e.g., from the memories being managed; or other sources, including a tracking component within the memory manager. The health information may provide information relative to the useful life of the memory. As an example, health information may indicate total number of write cycles that the memory is rated to endure or percentage of expected usable life that has already been used for a memory.

In some embodiments, the memory health information may comprise a lifetime defined as a number of times, or cycles, that a unit of memory can be written to, endurance of the memory, which may be defined as an expected storage time for the data in the memory, and other characteristics. The expected storage time for the data in the memory may be defined as a time during which the data can be reliably stored in the memory.

Health information may be maintained for any suitable unit of memory. The unit may be a segment of memory of any suitable size, which may be different depending on a type of a memory. For example, a block encompassing more than one byte, word or cache line may be utilized as a unit of a PCM, Flash or other secondary memory with a limited number of write cycles. In some embodiments, the block may be used as a unit of write access of the secondary memory and a unit of a finer granularity may be used for keeping track of read accesses to the secondary memory. The block may comprise hundreds or thousands of bytes or any other suitable number of bytes.

In some embodiments, an operating system of the computer system may receive information used in managing heterogeneous memory comprising memories of different types. Thus, the memory manager may be implemented in the operating system of the computer system. As such, the memory manager may manage the memories of different types while taking into account not only characteristics of the memories obtained from the memories, but also using characteristics of the data to be stored which may be obtained from a user, application or the operating system. The characteristics of the data may comprise, for example, criticality of the data, information on a time to store the data (e.g., expected or determined duration of time to store the data), information on accessing the data (e.g., an expected or determined frequency of access of the data, a type of access of the data such as a read, write or execute access) and other suitable characteristics.

The operating system and, in particular, the memory manager in accordance with some embodiments of the invention may manage memories in terms of units, such as pages. A physical page has a fixed physical address, but it may have multiple virtual addresses (e.g., for accesses from different OS processes) mapped to a single physical page. Accordingly, for purposes of this description, a "page" may refer to certain content stored in a location referred to in that page. A block as described above may be of the same size as a page or it may be a multiple or fraction of a size of the page.

In some embodiments, a computer system may employ multiple memory types that may have different characteristics. As such, the computer system may select a location to store data by selecting a type of memory in which to store the data. Characteristics of the memory and the data to be stored may be used to select a memory type. Furthermore, characteristics of the data to be stored in location within the heterogeneous memory may be utilized to select the location within a selected memory type.

FIG. 1 illustrates an example of a system 100 in which some embodiments of the invention may be implemented. System 100 may include memory 102 which comprises memories of different types and may therefore be referred to herein as a heterogeneous memory system. In this example, heterogeneous memory 102 has memories of two types: memory 104 of a first type, schematically denoted in FIG. 1 as a "Memory 1" and memory 106 of a second type, denoted, in a similar manner, as "Memory 2." As shown in FIG. 1, system 100 may also comprise operating system 108 providing an environment in which memory manager 110 and one or more applications 112 may execute. System 100 also comprises one or more suitable processor(s) 114 executing operating system 108. It should be appreciated that system 100 may comprise any other suitable components that are not shown for simplicity of representation.

In some embodiments, memory 104 may be used as a primary memory and memory 106 may be used as a secondary memory. The secondary memory 106 may have different characteristics from memory 104. For example, memory 106 may have a limited lifetime and different reliability as compared to memory 104. The primary memory may be, for example, a DRAM or a similar memory and the secondary memory may comprise a PCM, Flash or other memory with similar characteristics. Both of the primary and secondary memories may be directly accessible to one or more processors 114. It should be appreciated that even though two types of memories 104 and 106 are shown in FIG. 1, system 100 may comprise any suitable number of memories of different types that may be managed in a unified manner (e.g., as memory 102).

In the example illustrated, while memories 104 and 106 may be separate components of different types, they are shown schematically as included in heterogeneous memory 102 to indicate that memories 104 and 106 may be managed in a unified manner. Memory 102 may thus encompass a unified address space managed by a memory manager. Accordingly, FIG. 1 shows a memory manager 110 that manages access to memories 104 and 106. Memory manager 110 may be used to manage access to the memories by different applications (e.g., applications 112) and/or by suitable hardware devices (not shown). For this purpose, memory manager 110 may obtain information from hardware of system 100 (e.g., memories 104 and 106) and/or from suitable software components of system 100 such as operating system 108, one or more applications 112 executed by suitable processor(s) 114 and any other components. As such, memory manager 110 functions as an interface between operating system 108 and memory 102. It should be appreciated that memory manager 110 is illustrated in FIG. 1 as part of operating system 108 by way of example only, and memory manager 110 may be implemented as a combination of software and hardware and may be located outside of operating system 108. It should also be appreciated that in some scenarios operating system 108 may access memories 104 and 106 directly, without using memory manager 110 as an interface.

In some embodiments, information obtained and then utilized by memory manager 110 may comprise information pertinent to characteristics of memories 104 and 106, such as their memory heath information, as well as information on data to be stored in either of memories 104 and 106, such as criticality of the data and other characteristics. These types of information in any suitable combination may be used by memory manager 110 to first select a type of memory and to then determine a specific location in the selected memory to store the data. Furthermore, upon storing the data in a memory, memory manager 110 may keep track of changes in characteristics of memories 104 and 106 and/or their suitable units (e.g., a maximum, remaining or consumed lifetime, reliability etc.), and changes in characteristics of the stored data (e.g., number of times the data has been accessed, changes in criticality of the data, etc.). Memory manager 110 may then, based on this information, relocate the data into a different location either within the memory where the data has been stored or in a different memory. Also, in some scenarios (e.g., when the data has not been used for a predetermined period of time) the data may be stored (or "flushed") to disk.

As one example of criteria used to select memory locations, memory manager 110 may perform wear leveling of a memory with a limited lifetime and whose reliability may be compromised by excessive writing to the memory. The wear leveling may comprise limiting access to regions of such memory. To enforce a wear leveling strategy, memory manager 110 may indicate to an entity that attempts to write to a block in a memory with a limited lifetime that only a specified number of writes into the block is allowed overall, at this time and/or by this entity. Accordingly, another criteria used in selecting a location in memory may be whether the entity such as an application or hardware device requesting memory allocation meets criteria of trustability to ensure that the entity does not violate its permitted number of writes and that the entity reports the number of writes actually performed into the block. This can be ensured using suitable hardware component, such as, for example an Input/Output Memory Management Unit (IOMMU).

Figure 2:
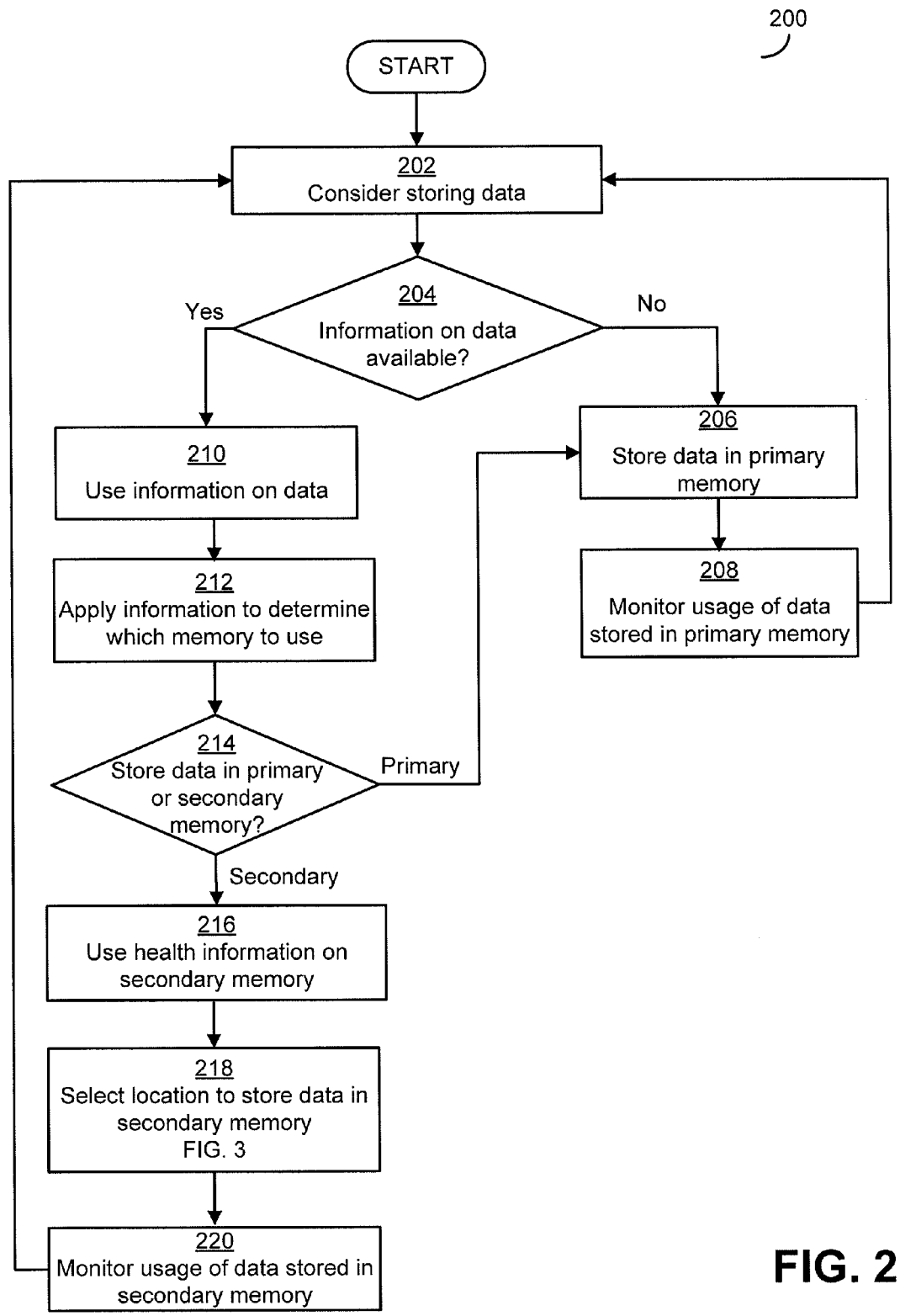
FIG. 2 is a flowchart illustrating a method of selecting a memory of a plurality of types of memories to store data in accordance with some embodiments.

FIG. 2 illustrates a process 200 of selecting a location in a memory in an embodiment in which there are primary and secondary memory of different types (e.g., memories 104 and 106 in FIG. 1) to store data, in accordance with some embodiments of the invention. In this example, the primary memory may be a memory such as a DRAM and the secondary memory may be a PCM, Flash or other similar memory that may have a lifetime shorter than that of the primary memory. Process 200 may be performed by a suitable component, such as, for example, memory manager 110 (FIG. 1) executed by one or more suitable processors as part of an operating system of a computer system (e.g., computer system 100 in FIG. 1).

Process 200 may start at any suitable time. For example, process 200 may start when operation of memory manager 110 is initiated. Any suitable indication to allocate a memory location to contain some data may be received. For example, a request from an application executed by a computer system may be received indicating that the application (e.g., application 112 in FIG. 1) desires to store the data in a memory or would like memory allocated for use by that application or device as it operates. Also, process 200 may be continuous meaning that it may execute when the computer system operates.

As shown in FIG. 2, process 200 may start with block 202 at which it may be considered whether to store data. In this context, "considering" the storage of the data may comprise either initial allocation of memory or, after the data has been stored, determining whether to relocate the stored data into a different location.

The relocation may be performed based on different factors related to managing a lifetime of the memories, an overall performance of the computer system and/or power utilization by components of the computer systems. For example, the type of memory where the data is stored may become full and the data may be relocated to free some space in the memory for other data that may more efficiently use that type of memory. As another example, the memory manager may detect a change in the information used to select a memory location for data, which would dictate a different location being selected when the selection criteria are reapplied. For example, if the stored data is being written frequently while that memory location is approaching its maximum lifetime (i.e., a maximum number of write cycles), the data may be relocated to prevent its loss. Overall, the relocation in accordance with some embodiments may allow efficient utilization of available memory resources.

Next, process 200 may continue to block 204, where it may be determined whether information on the data is available. An indication to allocate a memory location to contain the data may or may not be associated with information on the data. The information on the data may comprise different characteristics of data to be stored in the allocated segment, such as its criticality, expected read frequency, expected write frequency, expected total number of writes, and expected period over which data will be stored in the allocated segment. The information may be obtained from an application requesting that memory be allocated or determined based on one or more characteristics of the application. Alternatively or additionally, this information may be known to the operating system or obtained by the operating system such as by monitoring use of any allocated segment of memory or operation of an application or device.

In some scenarios, the information on the data may not be available. For example, when an indication to allocate a memory location to contain the data comprises a request from hardware, the information on the data may not be available. Though, the information on the data may not be available for other reasons, including when an application not configured to supply the information requests an allocation of memory.

Accordingly, if it is determined, at block 204, that the information on the data is not available, process 200 may branch to block 206 where the data may be stored in a default location. In this example, the default location is the primary memory (e.g., DRAM). Because DRAM generally does not wear out or become unreliable over the useful life of a computer system, any location with the DRAM may be selected.

As shown in FIG. 2, after the data is stored in the primary memory at block 206, process 200 may continue to block 208 where usage of the so stored data may be monitored. Such monitoring may result in obtaining information on the data that was not previously available. For example, as the allocated memory is being used (e.g., accessed to be read or written), information on a frequency of accessing the data may be collected. Also, other information on the data may become available in any suitable way.

Furthermore, as the usage of the data is being monitored at block 208, information available on characteristics of the primary memory may change, which may be then used to reevaluate whether the data's current location may be changed.

Accordingly, process 200 may then return to block 202 where process 200 may again consider allocating memory to store the data. At this point, considering storing the data may involve considering whether the data may be relocated from its current location.

If it is determined, at block 204, that the information on the data is available, process 200 may branch to block 210 where the information on the data may be used. The information may comprise different characteristics of the data. For example, it may include criticality of the data which may be defined as a degree of importance of the data to the operating system, the application, a user or other entity, that, in turn, determines amount of efforts to be taken to ensure that the data is reliably stored in a memory location. The information may also comprise an expectation of persistence of the data related to a time to store the data (e.g., expected or determined duration of time to store the data), information on accessing the data (e.g., an expected or determined frequency of access of the data, a type of access of the data such as a read, write or execute access) and any other suitable characteristics.

Next, at block 212, the information on the data may be applied to determine a type of memory to allocate to store the data. For this purpose, the information on the data may be used in any suitable way. In some embodiments, a plurality of policies may be formulated that may be used to determine in which memory to store the data. The policies may define how different information on the data may be used to determine a memory to store data.

Any suitable policies may be used and these policies may be applied with any suitable order of precedence or other suitable technique for combining results of multiple policies. In some embodiments, criticality of the data and/or information on a frequency of accessing the data may be used to determine in which memory to store the data. When the data is critical, it may be stored in the primary memory, while less critical data or data that is referred to as non-critical may be stored in the secondary memory. In some scenarios, the non-critical data that is frequently written may be stored in the primary memory. Though, the data may be stored in the primary memory regardless of its criticality.

As another example, if it is determined that the data is frequently accessed and/or that it is desirable that the data be accessed with a small latency, the data may be stored in the primary memory. Alternatively, if it is determined that the data is accessed infrequently, the location to store the data may be selected from the secondary memory. A frequency of accessing the data may be determined in any suitable way. For example, an expected frequency of accessing the data may be calculated based on historical information on accesses made to the data and other parameters. A number of accesses of the data that were actually observed may also be utilized. Furthermore, an entity that provides an indication to store the data (e.g., an application providing a corresponding request) may possess information on how frequently the data will be accessed.

Furthermore, a type of accesses to the data, such as a read, write or execute access may be used to determine which of the primary and secondary memories to select to store the data. For example, if the data is read frequently (e.g., a number of read accesses to the data during a certain period of time is above a predetermined threshold), and may therefore be referred to as "read-mostly" or, when it is only accessed to be read, "read-only" data, such data may be stored in the secondary memory. The information on the access type may be used in combination with the information on a frequency of accessing the data.

In some embodiments, an expected storage time for the data may be utilized at block 212 of FIG. 2. In some scenarios, the data may be expected to be stored for a large duration of time, which may be a period of time above a certain threshold. For example, the data may need to be persistent across reboots. Such data may be stored in the secondary memory. As another example, the data may need to be stored for a long period of time that may exceed a certain threshold, which may exceed the reliable endurance of the secondary memory. In such scenarios, the data may be stored in the primary memory.

As an example of another possible variation, when processing at block 212 comprises initial allocation of storage for the data, in some embodiments, a location to store the data may be first selected in the primary memory.

If an indication to allocate storage for the data is received from a non-trusted application or other software component, or a suitable hardware component, a location in the primary memory may be selected. Allocations from trusted software or hardware components may be performed within either the primary or secondary memory.

It should be appreciated that policies defined in accordance with some embodiments of the invention may be utilized so that other factors may be used to determine in which memory to store the data. In some embodiments, current or desired power states of one or more regions of the memories may be taken into consideration. Thus, if the computer system is powered down or is brought into a reduced power mode, memory allocations can be made accordingly to save power resources. For example, the memory regions may be kept idle for longer durations.

In some embodiments, when an indication to allocate a memory segment to contain the data is received in connection with an indication that the computer system is entering a power low mode or is being powered down, a non-volatile memory may be selected. Accordingly, in embodiments where the secondary memory is a non-volatile memory (e.g., PCM or Flash), such secondary memory may be selected to store the data during the low power or powered down mode.

As shown in FIG. 2, at decision block 214, it may be determined whether to store the data in the primary or secondary memory, based on the information on the data described above and any other suitable information.

When it is determined, at decision block 214, that the data may be stored in the primary memory, process 200 may branch to block 206 where a segment within the default memory which is, in this example, the primary memory, may be allocated. The usage of the data stored in the allocated segment of the primary memory may then be monitored, at block 208.

When it is determined, at decision block 214, that the data is to be stored in the secondary memory, process 200 may continue to block 216 where health information on the secondary memory may be used to then determine, at block 218, a location within a secondary memory to store the data. The health information may be used in any suitable combination with the information on the data stored in the allocated memory.

In some embodiments, health information about one or more units of the secondary memory may be obtained. The health information may indicate generally how suitable ("healthy") each unit is for data storage. For example, if the data is considered critical, it may be stored in one or more segments of the secondary memory that are deemed to be highly reliable. On the other hand, non-critical data may be stored in one or more segments of the secondary memory that are considered to be less reliable. The reliability of a memory segment may indicate an amount of time that the segment may be expected to hold the data so that the data may then be reliably read from the segment.

When the health information of a unit meets the criteria, it may be determined that the data may be stored in the unit. Otherwise, another memory location to store the data may be selected or other suitable measures may be taken.

The secondary memory, such as PCM, Flash or other memory, may be a memory with a limited number of write cycles allowed to be executed to a unit of the memory. Different units of memory may be closer to the maximum number of executed writes. Furthermore, the different units of such memory may be able to retain information for different periods of time and the reliability may vary across units of this memory. Also, a higher rate of write failures in one or more blocks of the secondary may be observed, which may or may not be easily detectable. Such characteristics of memory units may be considered in selecting specific units to allocate. The selection may be made in combination with information about data to be written to the allocated unit. For example, higher reliability units may be allocated to more critical data. Memory near the end of its useful life may be allocated to data with a low frequency of access. This may prevent premature wearing out of the secondary memory thus increasing efficiency and performance of the computer system, saving power and improving overall user experience. Though, any suitable policy or combination of policies may be used to select a unit or units of memory to allocate.

The health information may be obtained in any suitable way. In some embodiments, the health information may come from the secondary memory itself. In this respect, the secondary memory may track or measure health information on one or more units of a suitable granularity. For example, the unit of the secondary memory may be a block comprising a plurality of bytes, words or cache lines. Hence, the secondary memory may maintain, for one or more of its units, information related to a lifetime of the unit. Such information may be, for example, a maximum lifetime, a remaining lifetime, a consumed lifetime of the unit, or any other suitable information. The lifetime may be defined in terms of a number of write cycles of the unit. Alternatively, health information may be measured by hardware components associated with the memory chips physically containing the memory cells.

As another example, in some embodiments, counters that keep track of a number of currently executed write cycles and remaining write cycles, respectively, may be maintained for one or more units of the secondary memory. The counters may be maintained within the secondary memory or other hardware components. Values of these counters may be compared to suitable criteria, such as, for example, a maximum number of write cycles for the segments.

In other embodiments, a remaining lifetime or reliability of a unit of the secondary memory may be determined based on an error correcting code (ECC) utilized to correct data read from the unit. An ECC decoder can provide information about the frequency of errors which may provide an indication of the ability of the memory to retain information. When the amount of errors corrected by the ECC increases, it may indicate that an end of a lifetime of the unit is approaching. As another approach to determining a remaining lifetime of a segment, the content of the unit may be read after each write to verify that the content has been written accurately. It should be appreciated that other approaches to obtaining the health information of the secondary memory may also be utilized as embodiments are not limited in this respect.

The segment of the secondary memory may be of any suitable size. For example, a block comprising more than one byte, word or cache line may be utilized as a segment of the secondary memory. In some embodiments, the block may be used as a unit of write access of the secondary memory and a unit of a finer granularity may be used to keep track of read accesses to the secondary memory. In some scenarios, the block may comprise hundreds or thousands of bytes. Though, embodiments are not limited in this respect and the block may comprise any suitable number of bytes.

Further, in some embodiments, health information may alternatively or additionally be generated within the operating system. For example, the operating system may implement ECC, verify writes on data retention, or maintain usage counters to generate health information comparable to that which can be generated by hardware components. In some embodiments, the operating system may employ suitable statistical modeling techniques to estimate a remaining lifetime of a segment.

Referring back to FIG. 2, at block 218, one or more units within the secondary memory are selected based on the health information. One or more units with "health" meeting a policy for the data to be stored may be selected, as discussed above. An example of such selecting process is shown in connection with FIG. 3.

Next, usage of data stored in the selected location may be monitored, at block 220. The monitoring may comprise maintaining health information on the location, such as keeping track of a number of times that the data is accessed, a number of times that the data may still be accessed and any other suitable information. The monitoring may result in updating health information about the memory and/or updating information about the characteristics of the stored data. Process 200 may then return to block 202 where storage of the data may be reconsidered. In particular, it may be further determined whether to relocate the data into a different location either within the secondary memory or into a location in the primary memory, based on the health information.

Figure 3:
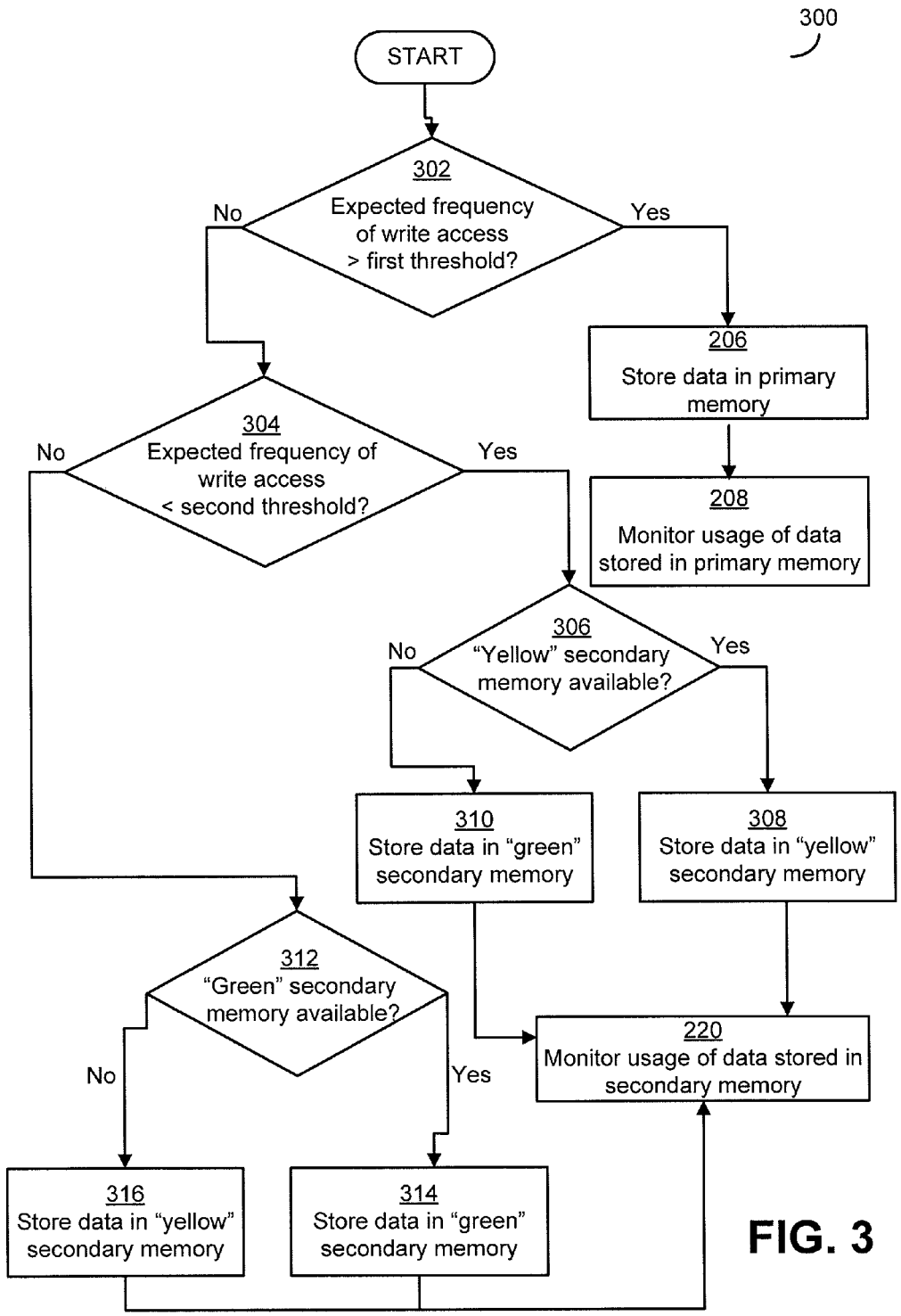
FIG. 3 is a flowchart illustrating a method of selecting a location in a memory of a plurality of types of memories to store data in accordance with an aspect of an embodiment.

FIG. 3 illustrates an exemplary embodiment of a method of operation of a memory manager in a computing device with a heterogeneous memory system. FIG. 3 may be taken as illustrating an example of the processing shown in connection with blocks 210-218 in FIG. 2. In this exemplary embodiment, memory health information is used to classify units of memory. Here, three possible classifications are shown, termed "red," "yellow" and "green." In this embodiment, memory units classified as "red" are not allocated. Accordingly, process 300 in FIG. 3 shows selecting a location in the secondary memory among regions of the secondary memory referred to as "green" and "yellow" secondary memories.

The "green" and "yellow" secondary memories may be located within the same secondary memory or may be parts of separate memories with a limited lifetime. For example, the "green" and "yellow" secondary memories may be included in a unified address space denoted as memory 102 in FIG. 1. It should be appreciated that a region of the secondary memory that is considered "green" may, as it is being used, become "yellow." The notations "green" and "yellow" are used herein for the illustration purposes only to indicate differences in a suitability of different regions of the secondary memory for data storage.

In the example illustrated, the "green" secondary memory may comprise one or more segments of the secondary memory that have a larger remaining lifetime and/or a smaller consumed lifetime than the "yellow" secondary memory. Also, the "green" secondary memory may comprise one or more memory segment characterized by a higher reliability than the "yellow" secondary memory.

It should be appreciated that, in some embodiments, one or more regions in the secondary memory may be referred to as "red" secondary memory meaning that these regions are less suitable for data storage than "yellow" regions and cannot therefore reliably store data. A remaining lifetime of the "red" regions of the secondary memory may be small. Though not illustrated in FIG. 3, in some scenarios, certain data (e.g., "read-only" data) may be stored in the "red" secondary memory. It should be appreciated that the division of the secondary memory into the "green" and "yellow" regions is shown by way of example only as one or more segments of the secondary memory may be characterized as belonging into a number of categories, based on the segment's memory health status. Individual segments (e.g., cells) of a memory on the same chip may have different characteristics, even when they have been manufactured using the same technology. For example, the categories may be defined based on the segment's remaining lifetime, consumed lifetime, or observed reliability. Such categories may allow allocating memory to store data and relocating the data in a more controlled and efficient manner.

Examples of the "green" secondary memory may include blocks with a good observed reliability and sufficient remaining lifetime or little consumed lifetime. Such blocks may have a reliability similar to that of the primary memory, such as DRAM and may thus be used to store critical data.

Process 300 may start at decision block 302 where it may be determined whether an expected frequency of write access of the data to be stored is above a threshold, referred to herein by way of example only as a first threshold. The threshold may be selected to indicate whether the data may be written or rewritten frequently. The expected frequency of write access of the data may be obtained in any suitable way. It may be received from an entity, such as an operating system, an application or any other component that may request memory be allocated for the data. Alternatively, it may be derived from an access history for that data. The write access history may not be available until after the data has already been stored and the information on the write accesses to the data may thus be obtained from monitoring usage of the data over a period of time and determining how many write accesses to the data have been made. The write access history may be determined from a history of a thread, process, file or other component that uses the data, from user input accessing the data and from any other suitable information.

It should be appreciated that FIG. 3 illustrates selecting a location to store the data based on the expected frequency of write access by way of example only. Other characteristics of the data, such as, for example, its criticality (e.g., when the data is used for booting the computer system or keeping it running correctly) and an expected storage time for the data, may be additionally or alternatively utilized to select a memory and a location within the memory to store the data. Furthermore, the expected frequency of write access is compared to the first threshold by way of example only as other criteria that need to be met to determine in which memory to store the data may be utilized.

When it is determined, at decision block 302, that the expected frequency of write access of the data to be stored is above the first threshold, units in the primary memory may be allocated, as shown by block 206 in FIG. 3. Usage of the data stored in the primary memory may then be monitored, at block 208, which is the same processing as shown in connection with block 208 in FIG. 2. For simplicity of the representation, further processing that follows block 208 is not shown in FIG. 3, but it should be appreciated that, like in process 200, process 300 may continue to block 202 after block 208.

If it is determined, at decision block 302, that the expected frequency of write access or the write access history of the data to be stored is not above the first threshold, process 300 may continue to a decision block 304 where it may be determined whether the expected frequency of write access is below a second threshold. The second threshold may be smaller than the first threshold and these thresholds may be set in any suitable way. Such a condition may indicate that the data is not expected or determined to be written or rewritten frequently. In this example, when the expected frequency of write access is above the second threshold but below the first threshold, the data may be stored in the "green" secondary memory, which is considered to be more reliable and/or may have higher remaining lifetime than the "yellow" secondary memory. Alternatively, when the expected frequency of write access is below the second threshold, the data may be stored in the "yellow" secondary memory.

Accordingly, if it is determined that the expected frequency of write access is below the second threshold, process 300 may continue to decision block 306 where it may be determined whether the "yellow" secondary memory is available. If this is the case, process 300 may branch to block 308, where one or more units in the "yellow" secondary memory may be selected and the data may be stored in locations in these units. Usage of this data stored in the "yellow" secondary memory may then be monitored, such as at block 220 (FIG. 2). For simplicity of the representation, further processing that follows block 220 is not shown in FIG. 3, but it should be appreciated that, like in process 200, process 300 may continue to block 202 after block 220.

If it is determined at decision block 306 that units of "yellow" secondary memory are not available, process 300 may continue to block 310, where one or more units in the "green" secondary memory may be selected and the data may be stored in locations in these units. Usage of this data may then be monitored, at block 220.

Referring back to decision block 304, when it is determined that the expected frequency of write access of the data is below the second threshold, process 300 may continue to decision block 312 where it may be determined whether units of "green" secondary memory are available. If this is the case, process 300 may branch to block 314, where units of "green" secondary memory may be selected and the data may be stored in locations in these units. Usage of this data may then be monitored, at block 220.

If it is determined, at decision block 312, that "green" secondary memory is not available, process 300 may continue to block 316, where units in "yellow" secondary memory may be selected and the data may be stored in locations in these units. Usage of this data may then be monitored, at block 220.

As shown in FIG. 3, processing at blocks 308, 310, 314 and 316 may follow to block 220. Similarly, processing at block 302 may follow to blocks 206 and 208. Thus, it should be appreciated that process 300, which may be an embodiment of part of process 200, may be continuous because usage of the data stored in a selected location in either the primary or the secondary memory may be further monitored, to allow updating of information defining characteristics of the data or health information about the memory.

Based on results of the monitoring, the data may be relocated into a different location either within the same memory or in a different memory.

For example, when the data is stored in a location in the "green" secondary memory, it may be determined that the data is not critical and/or that the expected frequency of write access becomes smaller than the second threshold. As a result, the data may be moved to a location in the "yellow" memory. Though, it should be appreciated that different policies may be used to determine whether to move data than those that are used to determine where to allocate memory to store that data. The differences in policies may reflect a cost of moving the data (e.g., in terms of power, performance, or lifetime impact). As another example, if the number of free locations in the "green" memory falls below a certain threshold, some data may be moved into the "yellow" memory. This may be performed as an attempt to ensure that certain number of free units is available at any time in the "green" memory.

As yet a further example, when data is stored in a location in the "yellow" secondary memory, it may be determined that the data has higher criticality and/or that the expected frequency of write access becomes greater than the second threshold but less than the first threshold. Accordingly, the data may be moved to a location in the "green" memory.

As yet another example, if a unit of secondary memory is written too many times, such that the unit has consumed more of its usable life than the other units in the memory on average, data may be moved from that unit to a unit that has been written less than average. In this way, the memory units may be wear leveled.

Moreover, as a result of monitoring or other updates to memory health information or one or more characteristics of shared data, a memory manager may move data between memories of different types. For example, when data is stored in the primary memory (e.g., at block 206 in FIGS. 2 and 3), read and write accesses to the data may be monitored (e.g., at block 208 in FIGS. 2 and 3). For example, respective rates of the accesses of a location storing the data may be measured. When the rates become smaller than a suitable threshold, which may be a predetermined threshold or a dynamically determined threshold, the memory manager may determine that it is more efficient to store the data in the secondary memory. Thus, if there are one or more "free" units (meaning that no data is stored in these segments) in the secondary memory, the data may be relocated into the secondary memory. Also, if the secondary memory comprises one or more units whose content has low access rates that allow storing the content in a block storage (e.g., a disk or other suitable storage), such content may be moved into the block storage and the data currently stored in the primary memory may be relocated into the one or more units of secondary memory thus freed.

In some embodiments, when the data is stored in a location in the secondary memory (e.g., at block 218 of FIG. 2) and a rate of access of the location becomes higher than a suitable threshold, which may be a predetermined threshold or a dynamically determined threshold, the memory manager may determine that it is more efficient to store the data in the primary memory. Thus, if there are one or more "free" units in the primary memory, the data may be relocated into the primary memory. Also, if the primary memory comprises one or more units whose content has low access rates that allow storing the content in a block storage (e.g., a disk or other suitable storage), such content may be moved into the block storage and the data currently stored in the secondary memory may be relocated into the one or more units in the primary memory thus freed.

In some embodiments, it may be determined that data stored in the secondary memory needs to be relocated into the primary memory. However, no free units in the primary memory may be available. In such scenarios, a location in the primary memory may therefore need to be freed. Accordingly, a unit in the primary memory may be selected that is accessed less frequently than other units in the primary memory. Frequency of access of data may be determined as a result of monitoring, as described above. When such a location in the primary memory is selected, the content of this location may be relocated into the secondary memory or into a suitable block storage, such as a disk. If the location is accessed with a small frequency, its content may be moved from the primary memory into the disk. Alternatively, the content may be moved into a region of the secondary memory, which may be determined, as shown, for example, in FIG. 3.

In some embodiments, it may be determined that a content of a unit in the primary memory needs to be relocated into the secondary memory when, however, no free units in the secondary memory are available. Accordingly, a unit in the secondary memory to be freed may be selected, based on, for example, the expected frequency of access of the location. Locations in the secondary memory may be categorized in accordance with their frequency and a time of access—e.g., least recently accessed, most frequently accessed, most recently accessed, etc. A location in the secondary memory to be freed may be selected based on one or more of the above parameters and based on characteristics of the new data to be written to the location after it is freed. For example, when the data is critical, it may need to be relocated into a location in the "green" secondary memory, and an appropriate "green" location may therefore be freed. Furthermore, a decision to relocate the data into either "green" or "yellow" memory may be made in accordance with processing shown in the example of FIG. 3.

Content of the location to be freed may be relocated into either the primary memory (e.g., when the content is accessed more frequently and/or when the content has been recently accessed) or into a block storage when, for example, the content is accessed less frequently and/or when the content has not been recently accessed. The data from the primary memory may then be relocated into the thus freed location in the "green" or "yellow" secondary memory.

Regardless of the event that triggers relocation of data in a memory, in some embodiments, the relocation of the data may be performed dynamically—i.e., as the memories are being used. Though, during the relocation, the units being relocated may be blocked from access.

Figure 4:
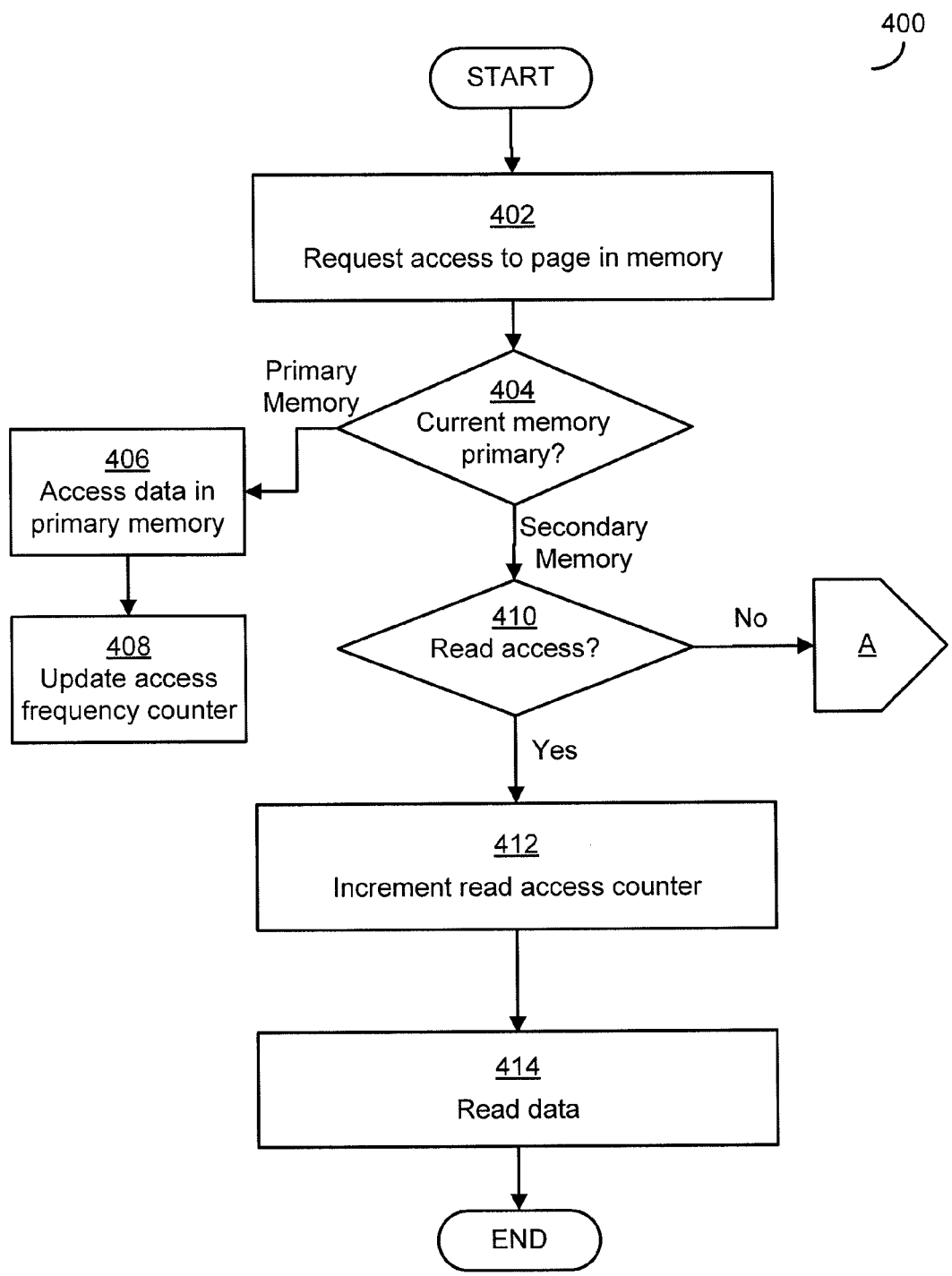
FIGS. 4-6 are flowcharts illustrating a method of storing and relocating data in a plurality of types of memories, in accordance with an aspect of an embodiment.
Figure 5:
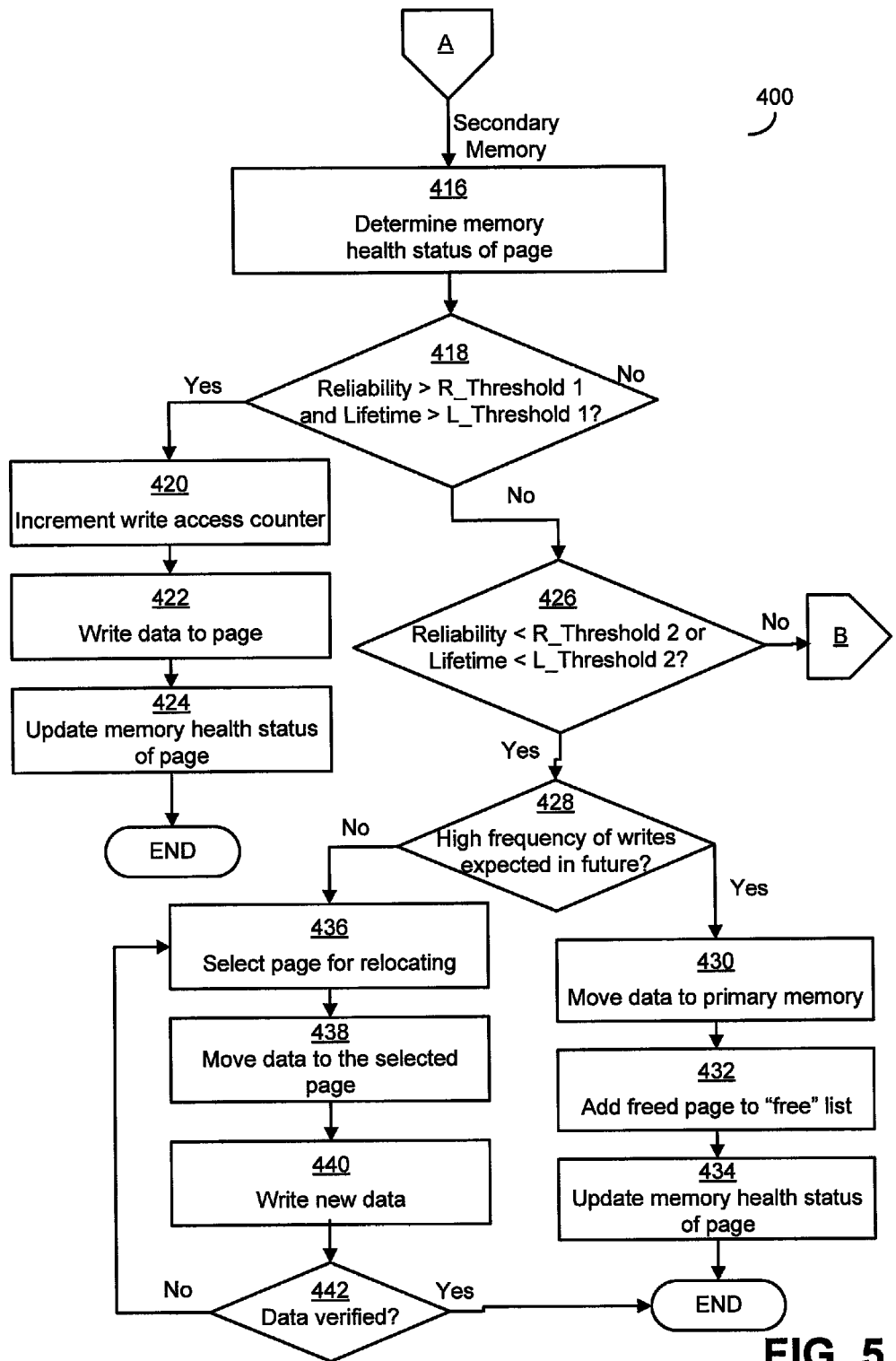
Figure 6:
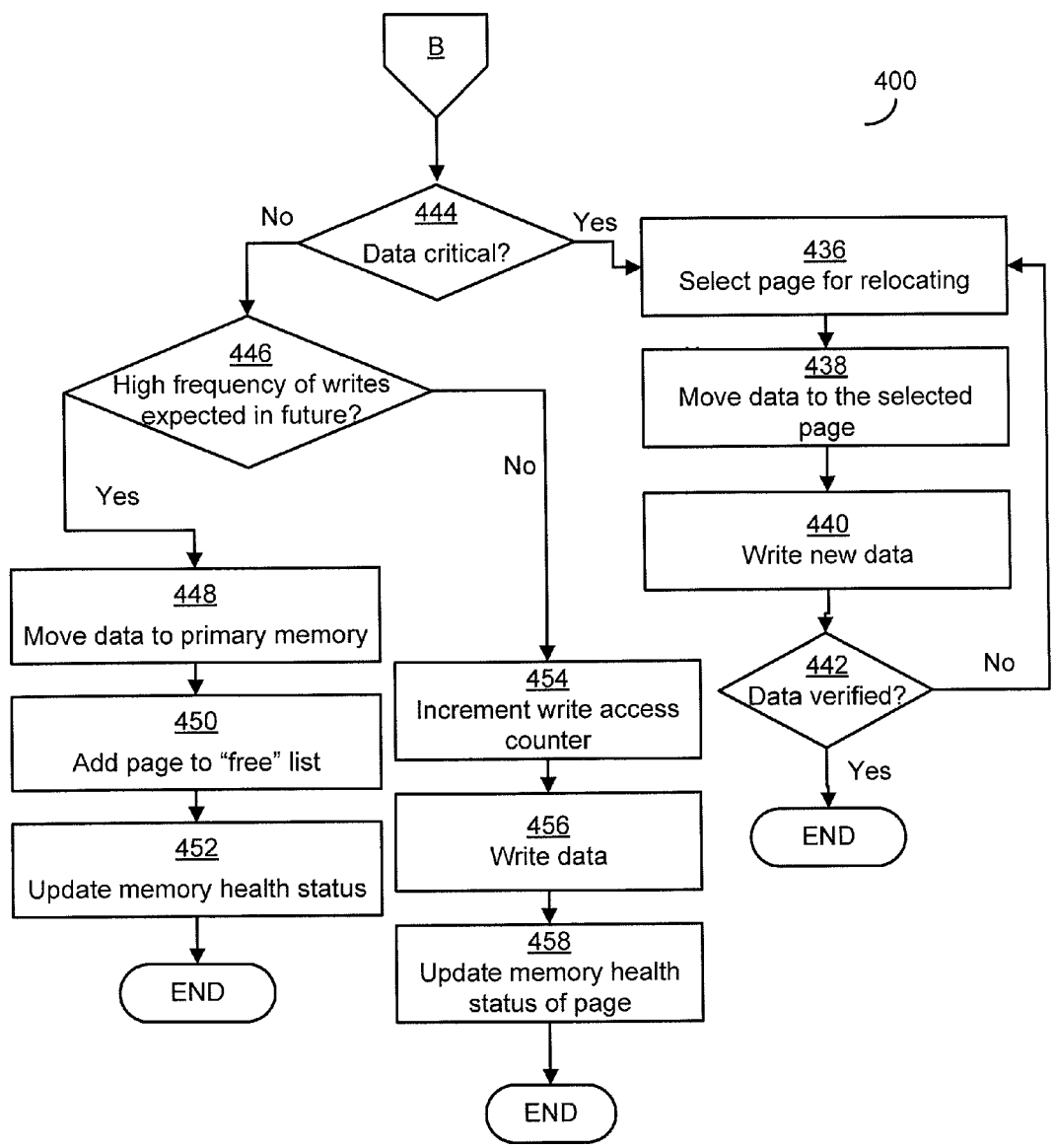

FIGS. 4-6 illustrate an exemplary process 400 of storing and relocating data in a heterogeneous memory system. Process 400 may start at any suitable time. For example, process 400 may start when a request is received to access the data stored in a unit of memory, which in this example is a page, in one of the memories. It may further be determined whether the data may be written or rewritten into the same page where it has been already stored or whether the data may be relocated into a different location. The access may be a write or read access.

A relocation of data stored in a page may be initiated in response to one or more suitable triggers. Nonlimiting examples of such triggers include a soft fault which may occur, for example, when an attempt is made to write into a page that has been designated as a "read-only" page. Furthermore, the relocation may be initiated when an observed number of accesses or rate of accesses of a certain type (e.g., write accesses) to a page exceeds a certain threshold. In some scenarios, the relocation may be considered based on a comparison of rates of certain types of accesses—for example, read access rates versus write access rates. These triggers may be detected within the memory manager or within memory hardware, which may signal the memory manager in any suitable way.

As shown in FIG. 4, at block 402, access to the page in the memory may be requested. Next, it may be determined, at decision block 404, whether the page is located in the primary or secondary memory. When the memory is primary, process 400 may branch to block 406, where the data stored in the page may be accessed. The access may be a write or read access. Next, at block 408, a respective counter used to keep track of frequency of accesses to the data may be updated accordingly.

When it is determined, at decision block 404, that the page being accessed is located in the secondary memory, process 400 may follow to a decision block 410 where a type of the access may be determined—i.e., whether the access is a read access. If this is the case, process 400 may continue to block 412 where a read access counter that keeps track of a number of read accesses to the data may be incremented and the data may then be read, at block 414. It should be appreciated that respective processing at blocks 412 and 414 may be executed in any suitable order.

When it is determined, at decision block 410, that the access is not the read access and is therefore a write access, process 400 may follow to execute steps described in connection with FIG. 5. Thus, process 400 may continue to block 416 in FIG. 5 where health information on the page of the secondary memory where the data is stored may be determined.

Next, at decision block 418, it may be determined whether a reliability of the page is above a threshold, denoted by way of example only as "R_Threshold 1," and whether a lifetime of the page is above another threshold, denoted by way of example only as "L_Threshold 1." The lifetime may be, for example, a remaining lifetime of the page. When the reliability and the lifetime of the page are above respective thresholds "R_Threshold 1" and "L_Threshold 1," this may indicate that the page may still be written to and that it is suitable for continuing storing the data. The thresholds "R_Threshold 1" and "L_Threshold 1" may be selected in any suitable manner.

When it is determined, at decision block 418, that the reliability of the page is above the threshold "R_Threshold 1" and the lifetime of the page is above the threshold "L_Threshold 1," process 400 may continue to block 420, where a write access counter of the page may be incremented. Next, the data may be written or rewritten into the page, at block 422. Further, at block 424, the memory health status of the page of the secondary memory may be updated accordingly. For example, the remaining lifetime of the page into which the data has been written may be decremented and a consumed lifetime of the page may be incremented.

When it is determined, at decision block 418, that the reliability of the page is not above the threshold "R_Threshold 1" and the lifetime of the page is not above the threshold "L_Threshold 1," process 400 may continue to another decision block 426, where it may be determined whether the reliability of the page is below another reliability threshold denoted as "R_Threshold 2" or whether the lifetime of the page is below another lifetime threshold denoted as "L_Threshold 2." These thresholds may be used to determine that the "health" of the page has deteriorated to some degree, meaning that the data may need to be relocated into another page. The threshold "R_Threshold 2" may be smaller than "R_Threshold 1" and the threshold "L_Threshold 2" may be smaller than "L_Threshold 1." In some embodiments, such page may be considered to be part of the "yellow" or "red" secondary memory. If the data is expected to be accessed frequently in the future, the data may need to be relocated into a page with a higher remaining lifetime.

When it is determined at decision block 426 that the reliability of the page is below threshold "R_Threshold 2" or that the lifetime of the page is below threshold "L_Threshold 2," process 400 may continue to decision block 428. At block 428, it may be determined whether a high frequency of write accesses to the data is expected in the future. If this is the case, process 400 may continue to block 430 where the data may be moved into the primary memory, which is typically more reliable and does not have lifetime limitations characteristic of the secondary memory. The page of the secondary memory from which the data was relocated is thus freed.

In some embodiments, a suitable component (e.g., memory manager 110 shown in FIG. 1) may maintain one or more lists of "free" memory pages for both the primary and secondary memory. Accordingly, at block 432, process 400 may add the freed page of the secondary memory to the list of "free" pages. Next, at block 434, the memory health status of the freed page of the secondary memory may be updated accordingly. Process 400 may then end. Though, it should be appreciated that process 400 may be continuous because usage of the data now stored in the primary memory may be monitored—for example, as shown at block 208 (FIG. 2).

When it is determined, at decision block 428, that the high frequency of write accesses to the data is not expected in the future, process 400 may continue to block 436 where another page within the secondary memory may be selected for relocating the data. Next, once such page is selected, the data may be moved and written into this page, as shown by blocks 438 and 440, respectively, in FIG. 5.

It may then be determined, at block 442, whether the written data is verified which may comprise determining that the data has been accurately written into the new location. The verification may be performed in any suitable manner. For example, the written data may be read by operating system 108, memory manager 110 (FIG. 1) or other suitable component, to determine that content of the memory matches what was written. When the data has been verified at block 442, process 400 may then end. Alternatively, when the data has not been verified at block 442, process 400 may return to block 436 where another page for relocating the data may be selected and processing at blocks 436-442 may then be repeated.

Referring back to decision block 426, when it is determined that the reliability of the page is not below the threshold "R_Threshold 2" and that the lifetime of the page is not below the threshold "L_Threshold 2," process 400 may continue to processing shown in connection with FIG. 6. The determination that the reliability of the page is not below the threshold "R_Threshold 2" (i.e., is equal to or above the threshold "R_Threshold 2") and the lifetime of the page is not below the threshold "L_Threshold 2" (i.e., is equal to or above the threshold "L_Threshold 2") may indicate that the memory is of a lesser health that the secondary memory, which is characterized by a reliability above "R_Threshold 1" and a lifetime above "L_Threshold 1" but is nevertheless more suitable for storing the data than a page with a reliability below "R_Threshold 2" or a lifetime below "L_Threshold 2." In some embodiments, such a memory with reliability between "R_Threshold 2" and "R_Threshold 1" and a lifetime between "L_Threshold 2" and "L_Threshold 1" may be referred to as a "green" secondary memory. Though, in some embodiments, such memory may be considered "yellow" memory whereas the secondary memory with reliability above "R_Threshold 1" and a lifetime above "L_Threshold 1" may be considered "green."

Next, at block 444, it may be determined whether the data is critical. If the data is indeed critical, process 400 may continue to blocks 436, 438, 440 and 442 which are shown again in FIG. 6 for the clarity of the representation but nevertheless represent the same processing as described in connection with blocks 436, 438, 440 and 442 in FIG. 5. Thus, when it is determined that the data is critical, the data may be relocated.

When it is determined, at block 444, that the data is not critical, process 400 may branch to block 446 where it may be determined whether a high frequency of writes to the page may be expected in the future. If the high frequency of writes may be expected, process 400 may continue to block 448, where the data may be moved into the primary memory. The page of the secondary memory from which the data was relocated is thus freed.

Next, at block 450, process 400 may add the freed page of the secondary memory to the list of "free" pages. The memory health status of the freed page may then be updated accordingly, at block 452. Process 400 may then end, as shown in FIG. 6. Though, as noted above, process 400 may be continuous because usage of the data now stored in the primary memory may be monitored—for example, as shown at block 208 (FIG. 2).

As shown in FIG. 6, when it is determined, at block 446, that the high frequency of writes to the page is not expected in the future, process 400 may branch to block 454 where a write access counter of the page may be incremented. Next, the data may be written or rewritten into the page, as shown by block 456. Further, at block 458, the memory health status of the page of the secondary memory may be updated accordingly. For example, the remaining lifetime of the page into which the data has been written may be decremented and a consumed lifetime of the page may be incremented.

The subject matter of some embodiments has been described with reference to the drawings, wherein like reference numerals are used to refer to like elements throughout. In the following description, for purposes of explanation, numerous specific details are set forth in order to provide a thorough understanding of the subject matter. It may be evident, however, that subject matter embodiments may be practiced without these specific details. In other instances, well-known structures and devices are shown in block diagram form in order to facilitate describing the embodiments.

Figure 7:
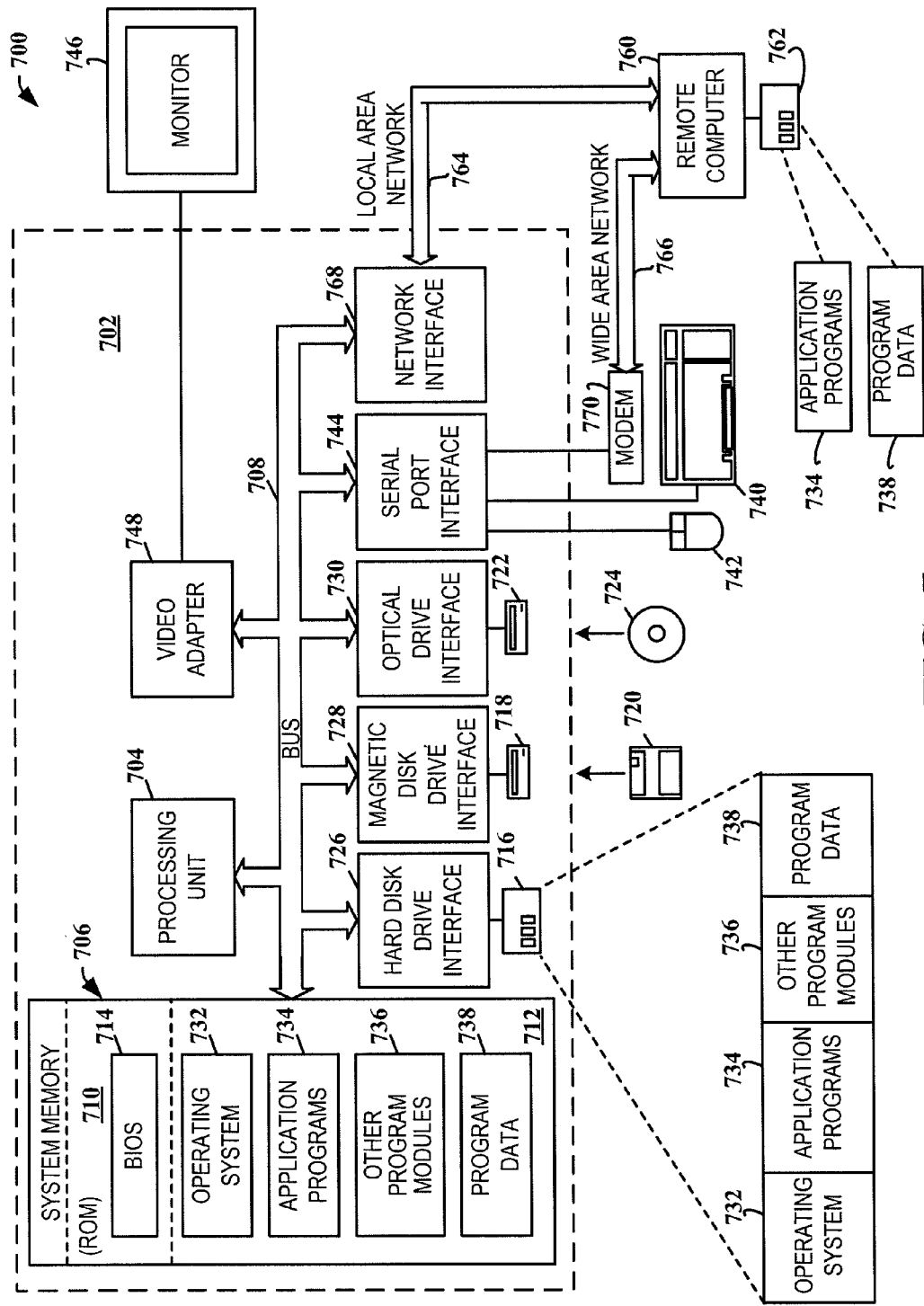
FIG. 7 illustrates an example operating environment in which an embodiment can function.

With reference to FIG. 7, an exemplary system environment 700 for implementing the various aspects of the embodiments include a conventional computer 702, including a processing unit 704, a system memory 706, and a system bus 708 that couples various system components, including the system memory, to the processing unit 704. The processing unit 704 may be any commercially available or proprietary processor. In addition, the processing unit may be implemented as multi-processor formed of more than one processor, such as may be connected in parallel.

The system bus 708 may be any of several types of bus structure including a memory bus or memory controller, a peripheral bus, and a local bus using any of a variety of conventional bus architectures such as PCI, VESA, Microchannel, ISA, and EISA, to name a few. The system memory 706 includes read only memory (ROM) 710 and random access memory (RAM) 712. A basic input/output system (BIOS) 714, containing the basic routines that help to transfer information between elements within the computer 702, such as during start-up, is stored in ROM 710.

The computer 702 also may include, for example, a hard disk drive 716, a magnetic disk drive 718, e.g., to read from or write to a removable disk 720, and an optical disk drive 722, e.g., for reading from or writing to a CD-ROM disk 724 or other optical media. The hard disk drive 716, magnetic disk drive 718, and optical disk drive 722 are connected to the system bus 708 by a hard disk drive interface 726, a magnetic disk drive interface 728, and an optical drive interface 730, respectively. The drives 716-722 and their associated computer-readable media provide non-volatile storage of data, data structures, computer-executable instructions, etc. for the computer 702. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, can also be used in the exemplary operating environment 700, and further that any such media may contain computer-executable instructions for performing the methods of the embodiments.

A number of program modules may be stored in the drives 716-722 and RAM 712, including an operating system 732, one or more application programs 734, other program modules 736, and program data 738. The operating system 732 may be any suitable operating system or combination of operating systems. By way of example, the application programs 734 and program modules 736 can include an item tagging scheme in accordance with an aspect of an embodiment.

A user can enter commands and information into the computer 702 through one or more user input devices, such as a keyboard 740 and a pointing device (e.g., a mouse 742). Other input devices (not shown) may include a microphone, a joystick, a game pad, a satellite dish, a wireless remote, a scanner, or the like. These and other input devices are often connected to the processing unit 704 through a serial port interface 744 that is coupled to the system bus 708, but may be connected by other interfaces, such as a parallel port, a game port or a universal serial bus (USB). A monitor 746 or other type of display device is also connected to the system bus 708 via an interface, such as a video adapter 748. In addition to the monitor 746, the computer 702 may include other peripheral output devices (not shown), such as speakers, printers, etc.

It is to be appreciated that the computer 702 can operate in a networked environment using logical connections to one or more remote computers 760. The remote computer 760 may be a workstation, a server computer, a router, a peer device or other common network node, and typically includes many or all of the elements described relative to the computer 702, although for purposes of brevity, only a memory storage device 762 is illustrated in FIG. 7. The logical connections depicted in FIG. 7 can include a local area network (LAN) 764 and a wide area network (WAN) 766. Such networking environments are commonplace in offices, enterprise-wide computer networks, intranets and the Internet.

When used in a LAN networking environment, for example, the computer 702 is connected to the local network 764 through a network interface or adapter 768. When used in a WAN networking environment, the computer 702 typically includes a modem (e.g., telephone, DSL, cable, etc.) 770, or is connected to a communications server on the LAN, or has other means for establishing communications over the WAN 766, such as the Internet. The modem 770, which can be internal or external relative to the computer 702, is connected to the system bus 708 via the serial port interface 744. In a networked environment, program modules (including application programs 734) and/or program data 738 can be stored in the remote memory storage device 762. It will be appreciated that the network connections shown are exemplary and other means (e.g., wired or wireless) of establishing a communications link between the computers 702 and 760 can be used when carrying out an aspect of an embodiment.

In accordance with the practices of persons skilled in the art of computer programming, the embodiments have been described with reference to acts and symbolic representations of operations that are performed by a computer, such as the computer 702 or remote computer 760, unless otherwise indicated. Such acts and operations are sometimes referred to as being computer-executed. It will be appreciated that the acts and symbolically represented operations include the manipulation by the processing unit 704 of electrical signals representing data bits which causes a resulting transformation or reduction of the electrical signal representation, and the maintenance of data bits at memory locations in the memory system (including the system memory 706, hard drive 716, floppy disks 720, CD-ROM 724, and remote memory 762) to thereby reconfigure or otherwise alter the computer system's operation, as well as other processing of signals. The memory locations where such data bits are maintained are physical locations that have particular electrical, magnetic, or optical properties corresponding to the data bits.

What has been described above includes examples of the embodiments. It is, of course, not possible to describe every conceivable combination of components or methodologies for purposes of describing the embodiments, but one of ordinary skill in the art may recognize that many further combinations and permutations of the embodiments are possible. Accordingly, the subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

Having thus described several aspects of at least one embodiment of this invention, it is to be appreciated that various alterations, modifications, and improvements will readily occur to those skilled in the art.

For example, categories of memory "green," "yellow" and "red" were described. Other categories are possible instead of or in addition to these categories. Another category may comprise blocks with reasonably good observed reliability and sufficient remaining lifetime or a medium amount of consumed lifetime. Such blocks may be used for storing somewhat less critical data.

A further category may comprise blocks with poor observed reliability (e.g., with a large number of correctable ECC errors. Such blocks are to be used with caution, which may include reading data after it has been written into such blocks to establish whether the write was successful. These blocks may be used for storing temporary data (e.g., the data that is to be discarded after a certain time), read-only data or other data.

An additional, fourth, category of the secondary memory may comprise blocks that are characterized with little remaining lifetime or large consumed lifetime but that are highly reliable for data storage. This category may therefore be differentiated from blocks with poor observed reliability because the blocks of the fourth category may provide highly reliable storage, but, at the same time, their lifetime may be close to a maximum lifetime (i.e., these blocks are starting to degrade and are close to being worn out). The wear leveling techniques in accordance with some embodiments may be used to make usage of such blocks less frequent by storing in these blocks "read-mostly," "read-only" data or other, similar data, which may be predominantly read from the blocks. For example, in some embodiments, the operating system may mark one or more such blocks as "read-only," so that memory manager 110 (FIG. 1) may then make a decision regarding write access to such blocks.

Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above. As used herein, the term "non-transitory computer-readable storage medium" encompasses only a computer-readable medium that can be considered to be a manufacture (i.e., article of manufacture) or a machine.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A computing device, comprising:
   at least one primary memory;
   at least one secondary memory;
   at least one processor;
   a memory manager located in an operating system of the computing device that:
   determines memory health information for at least three portions of the at least one secondary memory, the memory health information including life expectancy information for portions of the at least three portions of the at least one secondary memory, and the at least three portions of the at least one secondary memory including at least one portion at each of three different levels of life expectancy;
   determines at least one characteristic of data to be stored in local memory of the computing device, wherein the local memory of the computing device includes the at least one primary memory and the at least one secondary memory;
   determines whether to store the data in the at least one primary memory or in the at least one secondary memory based on the at least one determined characteristic of the data;
   selects, in response to a determination that the data is to be stored in the at least one secondary memory, a particular portion of the at least three portions of the at least one secondary memory based on an expected frequency of write accesses to the data and based on the memory health information; and
   stores the data in the selected portion.

2. The computing device of claim 1, wherein the memory health information comprises information on a maximum number of write cycles of the at least one secondary memory.

3. The computing device of claim 1, wherein the at least one primary memory comprises volatile memory and the at least one secondary memory comprises non-volatile memory.

4. The computing device of claim 1, wherein:
   the computing device further comprises an application; and
   the at least one characteristic of the data is determined based on a characteristic of the application.

5. The computing device of claim 1, wherein the at least one primary memory and the at least one secondary memory are configured as part of a unified address space managed by the memory manager.

6. The computing device of claim 1, wherein the memory manager also selects the location in response to receiving the allocation request.

7. The computing device of claim 6, wherein the source of the allocation request is at least one of an application or a device.

8. The computing device of claim 1, wherein the at least one characteristic of the data indicates a criticality of the data.

9. The computing device of claim 1, wherein the memory manager also:
   determines, based on a future expected frequency of write accesses to the data stored in the selected portion, that the data stored in the selected portion is to be moved to the at least one primary memory; and
   moves the data to the at least one primary memory.

10. The computing device of claim 9, wherein the memory manager also:
    in response to the movement of the data to the at least one primary memory, adds the selected portion to a list of free portions of memory; and
    updates the life expectancy information for the selected portion.

11. A computer-readable storage medium comprising computer-executable instructions, that, when executed by at least one processor, perform a method comprising:
    receiving an indication to allocate a memory location to contain data, the indication including information regarding a characteristic of the data;
    selecting, by an operating system based memory manager, a second type of memory from among a plurality of local types of memory of a computing device, the selecting comprising:

selecting between at least a first type of memory of the computing device and the second type of memory of the computing device based on the information regarding the characteristic of the data, the second type of memory being organized into at least three segments, and the at least three segments of the second type of memory including at least one segment at each of three different life expectancies;

selecting, in response to the selection of the second type of memory, a segment from the at least three segments for storage of the data based on an expected frequency of write accesses to the data and based on life expectancy information for the selected segment; and storing the data in the selected segment of the second type of memory of the computing device.

12. The computer-readable storage medium of claim 11, wherein the computer-executable instructions comprise an operating system of the computing device.

13. The computer-readable storage medium of claim 11, wherein the first type of local memory of the computing device and the second type of local memory of the computing device are configured as part of a unified address space managed by the memory manager.

14. The computer-readable storage medium of claim 11, wherein:
the characteristic of the data indicates an expected storage time for the data.

15. The computer-readable storage medium of claim 11, wherein:
the characteristic of the data indicates a criticality of the data.

16. The computer-readable storage medium of claim 14, wherein:
the indication to allocate the memory location to contain data is received in connection with an indication that the computing device is entering a low power or sleep mode; and
selecting the type of the local memory comprises selecting a non-volatile memory type.

17. The computer-readable storage medium of claim 11, wherein the second type of local memory comprises at least one of phase-change memory and Flash memory.

18. A method of managing memory of a computing device, the method comprising:

receiving, by a memory manager of an operating system, in conjunction with an indication to allocate a memory location to contain data, information indicating a characteristic of the data;

selecting, by the memory manager of the operating system, between at least a first type of memory of the computing device and a second type of memory of the computing device based on the information received by the memory manager, the second type of memory being organized into at least three segments, and the at least three segments of the second type of memory including at least one segment at each of three different levels of life expectancy;

selecting, in response to a selection of the second type of memory for storage of the data, a particular segment from the at least three segments for storage of the data based on an expected frequency of write accesses to the data and based on health information reflecting a life expectancy for the particular segment; and storing the data in a location in the selected particular segment of the second type of memory.

19. The method of claim 18, wherein the method further comprises:
determining that the selected type of memory is the second type of memory;
in response to determining that the selected type of memory is the second type of memory, obtaining the health information for the particular segment, and health information for one or more other segments of the second type of memory; and
selecting the particular segment of the second type of memory based on the health information for the particular segment and based on the health information for the one or more other segments of the second type of memory.

20. The method of claim 19, wherein the health information for the particular segments comprises information on an expected number of remaining write cycles of the particular segment.

21. The method of claim 18, wherein the characteristic of the data indicates a criticality of the data.

* * * * *